(12) United States Patent
Lin

(10) Patent No.: US 10,158,353 B2
(45) Date of Patent: Dec. 18, 2018

(54) DUTY CYCLE CORRECTION METHOD

(71) Applicant: Cavium, LLC, Santa Clara, CA (US)

(72) Inventor: David Lin, Westborough, MA (US)

(73) Assignee: Cavium, LLC, Santa Clara, CA (US)

( * ) Notice: Subject to any disclaimer, the term of this patent is extended or adjusted under 35 U.S.C. 154(b) by 0 days.

(21) Appl. No.: 15/496,294

(22) Filed: Apr. 25, 2017

(65) Prior Publication Data
US 2018/0309430 A1   Oct. 25, 2018

(51) Int. Cl.
| H03K 3/015 | (2006.01) |
| H03K 5/156 | (2006.01) |
| H03L 7/081 | (2006.01) |
| H03K 5/159 | (2006.01) |
| H03M 1/10 | (2006.01) |

(52) U.S. Cl.
CPC .......... *H03K 5/1565* (2013.01); *H03K 5/159* (2013.01); *H03L 7/0814* (2013.01); *H03M 1/1009* (2013.01)

(58) Field of Classification Search
None
See application file for complete search history.

(56) References Cited

U.S. PATENT DOCUMENTS

| 9,143,140 B2 | 9/2015 | Lin et al. |
| 9,281,034 B2 | 3/2016 | Lin |
| 9,306,584 B2 | 4/2016 | Lin et al. |
| 2010/0109725 A1* | 5/2010 | Yun ........ H03L 7/0814 327/158 |
| 2010/0156487 A1* | 6/2010 | Kim ....... H03K 5/1565 327/158 |
| 2010/0289542 A1* | 11/2010 | Yun .......... H03K 5/04 327/158 |
| 2012/0154006 A1* | 6/2012 | Ahn ....... H03K 5/1565 327/175 |
| 2014/0333361 A1* | 11/2014 | Chau ....... H03K 3/017 327/175 |
| 2015/0323579 A1* | 11/2015 | Im .......... G01R 29/023 324/76.39 |

* cited by examiner

*Primary Examiner* — Cassandra Cox
(74) *Attorney, Agent, or Firm* — Hamilton, Brook, Smith & Reynolds, P.C.

(57) ABSTRACT

The present disclosure includes circuits and methods that adjust and correct duty cycles of circuits. The circuits and methods receive a signal from a first circuit and forward the received signal to a second circuit that retrieves a first setting (X) that provides a measure of duty cycle of the received signal. The circuits and methods then invert the received signal, retrain the second circuit based upon the inverted received signal, and retrieve a second setting (Y) of the retrained second circuit. The second setting (Y) provides a measure of duty cycle of the inverted received signal. The circuits and methods then adjust the duty cycle of the received signal based upon the first and second settings (X, Y) and further retrain of the second circuit to provide an improved duty cycle in a direction closer to 50 percent.

20 Claims, 14 Drawing Sheets

Case study

| | Invert | | DLL 0 | DLL 1 | DLL 2 | DLL 3 | DLL 4 | DLL 5 | DLL 6 | DLL 7 | DLL 8 |
|---|---|---|---|---|---|---|---|---|---|---|---|
| Test 0 | PLL0 | 0 | DDR0 DLL setting | 56 | 57 | 57 | 57 | 58 | 56 | 54 | 55 | 55 |
| | PLL1 | 0 | DDR1 DLL setting | 54 | 54 | 54 | 55 | 53 | 54 | 56 | 56 | 58 |
| Test 1 | PLL0 | 0 | DDR0 DLL setting | 54 | 54 | 57 | 57 | 56 | 55 | 53 | 53 | 53 |
| | PLL1 | 1 | DDR1 DLL setting | 65 | 65 | 64 | 66 | 65 | 64 | 68 | 68 | 68 |
| Test 2 | PLL0 | 1 | DDR0 DLL setting | 65 | 65 | 67 | 67 | 66 | 66 | 64 | 64 | 65 |
| | PLL1 | 0 | DDR1 DLL setting | 53 | 53 | 55 | 55 | 53 | 57 | 57 | 57 | 58 |

1. "0" means non-inverting, "1" means inverting output from PLL

FIG. 8

DUTY CYCLE CORRECTION METHOD

BACKGROUND

A typical circuit may distribute one or more clock signals to one or more local circuits that may be included in or separate from the typical circuit. Such circuits may be included on an Application Specific Integrated Circuit (ASIC), a Printed Circuit Board (PCB), or any circuit known to one skilled in the art. Each of these clock signals have a duty cycle, which may be defined as the fraction of the clock cycle's period in which the clock signal is active. Ideally, these clock signals have a duty cycle of 50 percent. However, these clock signals can become distorted due to various considerations, such as noise or physical process. As such, a technique is needed to correct the duty cycle of such clock signals to be closer to the ideal of 50 percent.

SUMMARY

As such, the present disclosure is directed to circuits and methods that adjust (and/or correct) duty cycles of circuits (and/or signals associated with the circuits). In some embodiments, the circuits and methods may receive a signal from a first circuit and forward the received signal to a second circuit. In some embodiments, the circuits and methods may train the second circuit based upon the received signal. In some embodiments, the circuits and methods may retrieve a first setting (X) of the trained second circuit associated with the received signal. The first setting (X) may provide a measure of duty cycle of the received signal. In some embodiments, the circuits and methods may invert the received signal, retrain the second circuit based upon the inverted received signal, and/or retrieve a second setting (Y) of the retrained second circuit. The second setting (Y) may provide a measure of duty cycle of the inverted received signal. In some embodiments, the circuits and methods may adjust the duty cycle of the received signal based upon an adjustment value including the first setting (X) and the second setting (Y). In some embodiments, the circuits and methods may further retrain the second circuit based upon the adjusted received signal.

In some embodiments of the circuits and methods, the first circuit may include (and/or may be) a phase locked loop (PLL). The PLL may be configured to adjust the duty cycle. The second circuit may include (and/or may be) a delay locked loop (DLL). In some embodiments, the first circuit may include a differential analog-to-digital converter. The received signal may be a digital signal provided by a differential analog-to-digital converter as the first circuit.

The first setting (X) may provide a measure of pulse width associated with the received signal. In some embodiments, the circuits and methods may further adjust the duty cycle of the received signal based upon the measure of pulse width (associated with the received signal). The second setting (Y) may provide a measure of pulse width associated with the inverted received signal. In some embodiments, the circuits and methods may further adjust the inverted received signal based upon the measure of pulse width (associated with the inverted received signal).

In some embodiments, the circuits and methods may comprise one or more of: at least one of the first setting (X) and the second setting (Y) indicating a number of delay taps; and the retrieving of at least one of the first setting (X) and the second setting (Y) based upon one or more register reads.

In some embodiments, the circuits and methods may retrieve a given setting of the second circuit based upon the further retraining, and may perform the following sequence of steps one or more times without limitation (e.g., in any order, any number of the steps): (1) performing a comparison between the given setting of the second circuit and the adjustment value; (2) further adjusting the received signal based upon the comparison; (3) performing a given additional retraining of the second circuit based upon the further adjusted received signal; and/or (4) retrieving the given setting of the second circuit based upon the additional retraining.

Adjusting the received signal may include modifying the duty cycle of the received signal in a direction closer to a 50 percent duty cycle. In addition, the received signal may be a periodic signal.

In some embodiments, the circuits and methods may comprise a duty cycle controller and/or a duty cycle corrector (DCC, also known as "duty cycle adjuster" herein). The duty cycle corrector (DCC, also known as "duty cycle adjuster" herein) may be configured to receive a signal from a first circuit and forward the received signal to a second circuit. The duty cycle corrector (DCC) may be part of a third circuit, part of the first circuit, and/or part of the second circuit.

According to some embodiments, the duty cycle controller may be configured to train the second circuit based upon the received signal. The duty cycle controller may be part of a third circuit, part of the first circuit, and/or part of the second circuit. The duty cycle controller may be further configured to retrieve a first setting (X) of the trained second circuit associated with the received signal. The first setting (X) may provide a measure of duty cycle of the received signal. The duty cycle corrector may be further configured to invert the received signal. The duty cycle controller further may be configured to retrain the second circuit based upon the inverted received signal and/or to retrieve a second setting (Y) of the retrained second circuit. The second setting (Y) may provide a measure of duty cycle of the inverted received signal. The duty cycle corrector may be further configured to adjust the duty cycle of the received signal based upon an adjustment value including the first setting (X) and the second setting (Y). The duty cycle controller may be further configured to retrain the second circuit based upon the adjusted received signal.

In some embodiments of the circuits and methods, the first circuit may be a phase locked loop (PLL). The PLL may be configured to adjust the duty cycle. The second circuit may be a delay locked loop (DLL). In some embodiments, the first circuit may include a differential analog-to-digital converter. The received signal may be a digital signal provided by a differential analog-to-digital converter of the first circuit. The first setting (X) may provide a measure of pulse width associated with the received signal. The duty cycle corrector may be further configured to further adjust the duty cycle of the received signal based upon the measure of pulse width. The second setting (Y) may provide a measure of pulse width associated with the inverted received signal. The duty cycle corrector (DCC) may be further configured to further adjust the inverted received signal based upon the measure of pulse width.

Some embodiments of the circuits and methods may further comprise one or more of: at least one of the first setting (X) and the second setting (Y) indicating a number of delay taps; and the duty cycle controller further configured to retrieve at least one of the first setting (X) and the second setting (Y) based upon one or more register reads.

The duty cycle controller may be further configured to retrieve a given setting of the second circuit based upon the further retraining. The duty cycle controller may be further configured to perform the following sequence of steps one or more times (in any combination or order, without limitation): (1) perform a comparison between the given setting of the second circuit and the adjustment value; (2) further adjust the duty cycle of the received signal based upon the comparison; (3) perform a given additional retraining of the second circuit based upon the further adjusted received signal; and/or (4) retrieve the given setting of the second circuit based upon the additional retraining. In addition, the duty cycle corrector (DCC) may be further configured to further adjust the duty cycle of the received signal including modifying the duty cycle of the received signal in a direction closer to a 50 percent duty cycle. The received signal may be a periodic signal.

According to some embodiments of the circuits and methods, the criteria to reach the 50 percent duty cycle may include but is not limited including the following. The first setting (X) may represent a positive pulse width of the received signal (e.g., given clock signal). The second setting (Y) may represent a positive pulse width of the inverted clock signal. If the value of the positive pulse width of the first setting (X) equals the value of the positive pulse width of the second setting (Y), then the two pulse widths (X, Y, respectively) are considered to be the same, and, as such, the received signal (e.g., given clock signal) is considered to be 50-50 (e.g., a 50 percent duty cycle). However, if one of the pulse widths (of first setting X, second setting Y, respectively) is bigger than the other corresponding pulse width (of second setting Y, first setting X, respectively), then the duty cycle of the received signal may be adjusted accordingly through iterative training on the second circuit, such that the final setting from non-inverted and inverted clocks (the received signal and the inverted clock signal) is (X+Y)/2. In some embodiments of the circuits, if one of the pulse widths (of first setting X, second setting Y, respectively) is bigger than the other corresponding pulse width (of second setting Y, first setting X, respectively), then the duty cycle corrector (DCC) may be adjusted accordingly through iterative training on the second circuit, such that the final setting from non-inverted and inverted clocks (the received signal and the inverted clock signal) is (X+Y)/2.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1D also illustrates how a distorted duty cycle may result in an erroneous inverse of a corresponding 180 degree offset (element 188).

FIG. 8 illustrates a case study of the effects of process variation on duty cycle, according to some embodiments of the present disclosure.

DETAILED DESCRIPTION

A description of example embodiments of the invention follows.

Figure 1A:
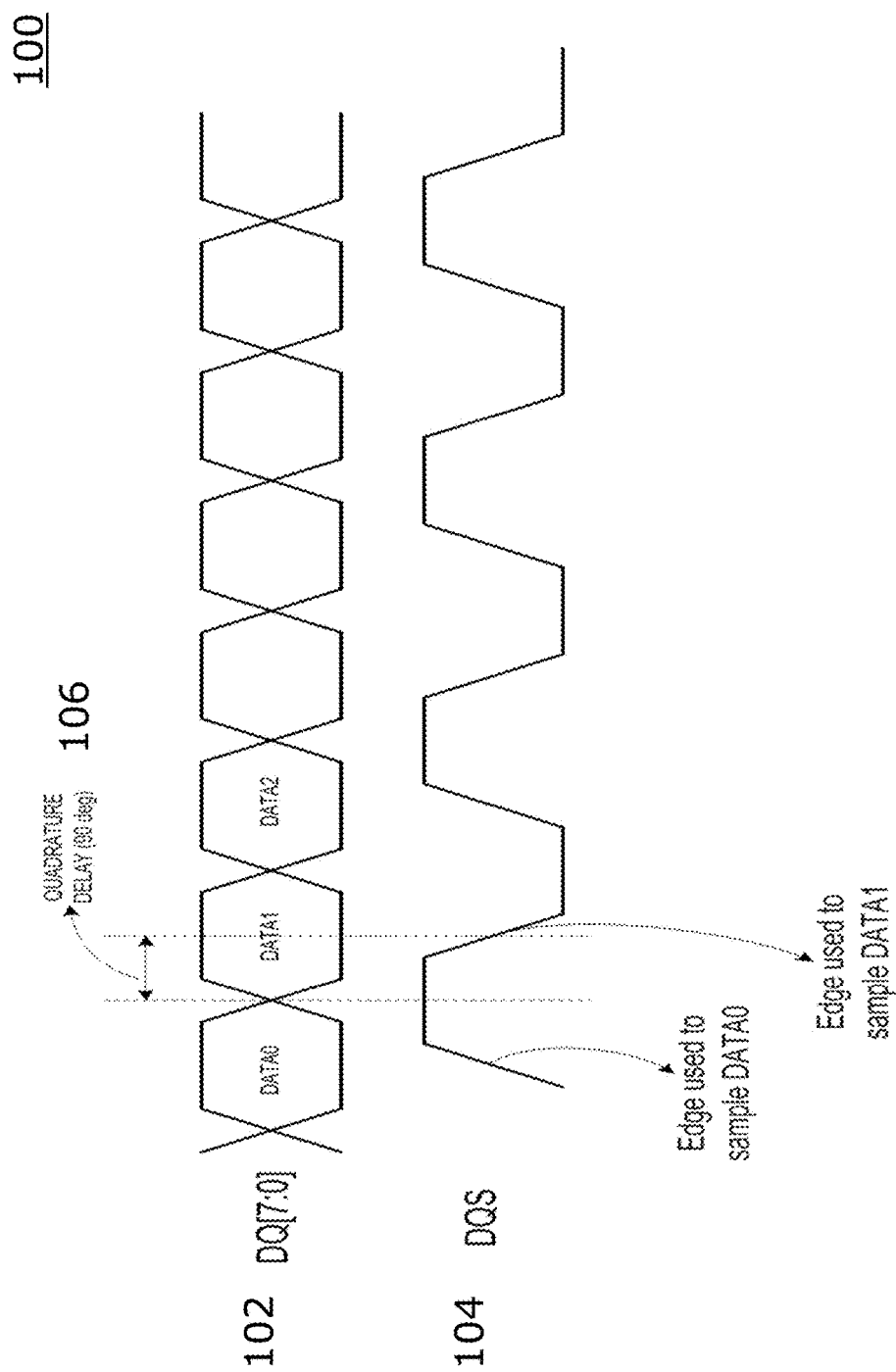
FIG. 1A shows the waveforms of data bits and data bytes associated with an Synchronous Dynamic Random Access Memory (SDRAM) design, according to some embodiments of the present disclosure.

As discussed in U.S. Pat. No. 9,143,140 B2, incorporated by reference herein in its entirety, in a typical Synchronous Dynamic Random Access Memory (SDRAM) design, each data byte (8 bits of data) may be associated with a dedicated data strobe (DQS). The data bits (DQ) and a DQS may be bidirectional buses that are driven by the memory controller during a memory write and driven by the memory during a memory read. During a memory write, the memory controller may output a DQS and DQ bits to be center-aligned, i.e. ¼ clock period off from each other (also known as a quadrature cycle). During a memory read, the memory may send back DQS and DQ edge aligned, and the controller then may delay the incoming DQS to be a ¼ clock period off the incoming DQ bits. The DQS signal may be used to sample the data bits (DQ[7:0]) by the memory during a write and by the memory controller during a read. FIG. 1A (element 100) shows the waveforms of DQ (element 102) and DQS (element 104) after the quadrature phase shift (element 106).

a) Quadrature DLL. According to some embodiments, as shown in the block diagram of FIG. 1B, a quadrature delay-locked loop (DLL, element 120) may be used to generate a delay equivalent to ¼ of the clock period (90 degrees, element 124) from a given input clock CLK0 (element 122). This is typically achieved using two delay lines (elements 130, 132, respectively), a bang-bang phase detector (element 134) and a finite state machine (FSM) controller (element 136). Upon deassertion of reset, the controller 136 may initialize the delay lines 130, 132 at their minimum setting. Thereafter, the controller 136 may continually increment the setting of both the delay lines 130, 132 until inverted CLK180's (element 126) rising edge crosses the rising edge of CLK0 (element 122). At this stage, the quadrature DLL (element 120) is considered locked and CLK90 (element 124) is delayed from CLK0 (element 122) by ¼ clock period.

Figure 1B:
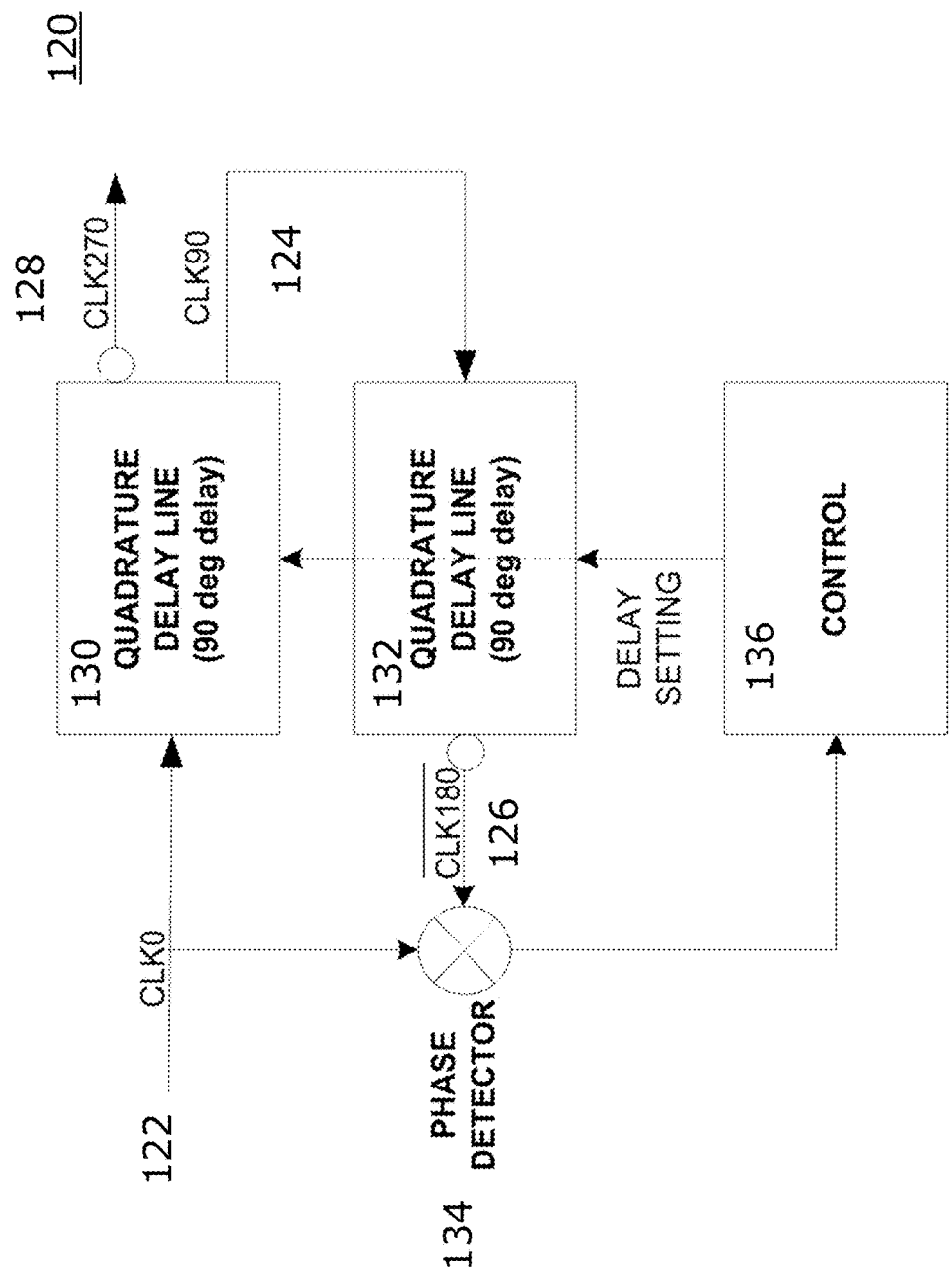
FIG. 1B is a block diagram of a quadrature DLL, according to some embodiments of the present disclosure.
Figure 1C:
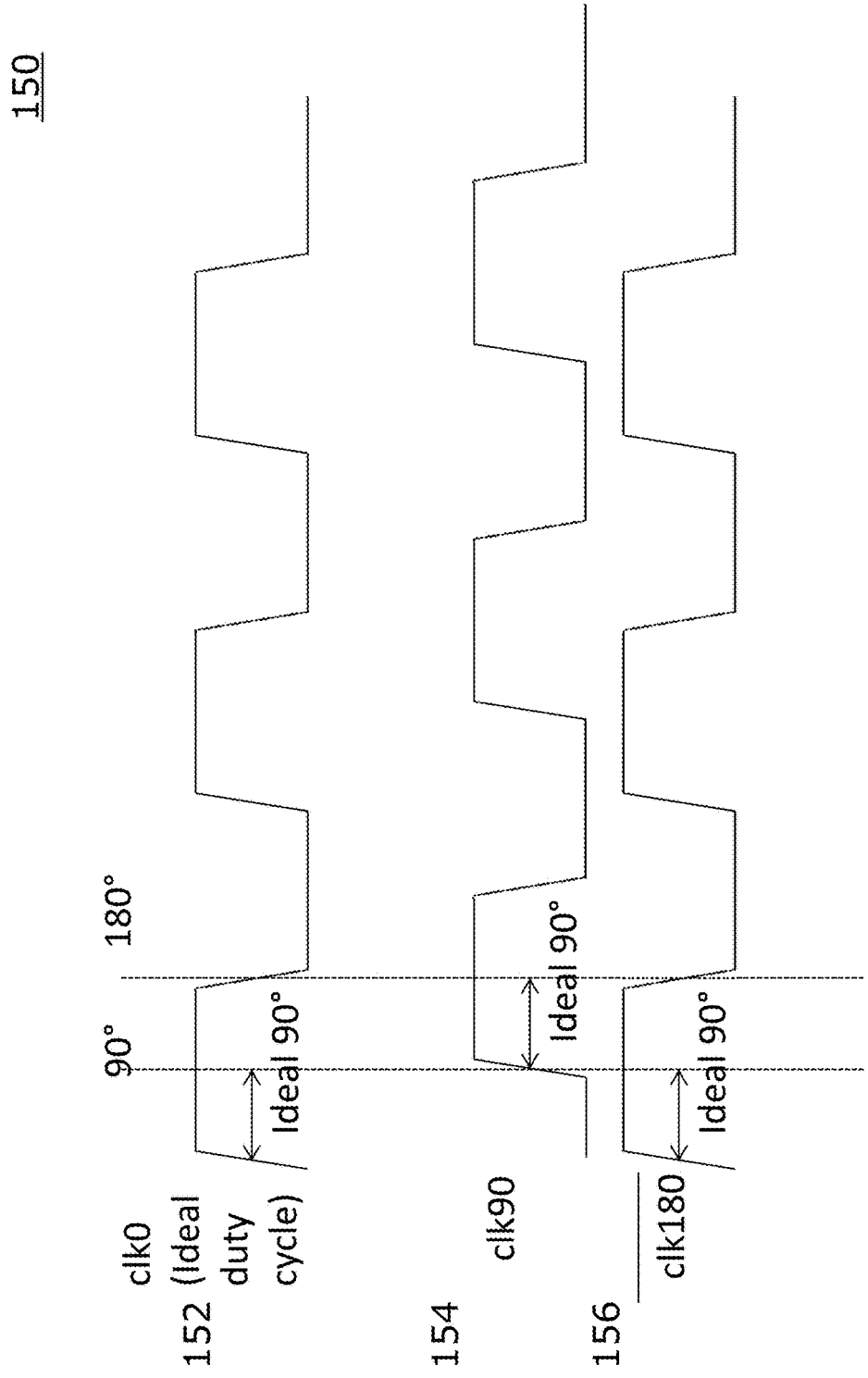
FIG. 1C is a signal diagram of inputs and outputs of a quadrature DLL, according to some embodiments of the present disclosure.

FIG. 1C (element 150) illustrates locking waveforms corresponding to the quadrature DLL of FIG. 1B. As illustrated in the ideal case of FIG. 1C (element 150), ideal duty cycle (element 152) generates perfect 90 degree offset (element 154) from DLL90 calibration. FIG. 1C also illustrates the inverse of a corresponding 180 degree offset (element 156).

However, in some scenarios, including but not limited to when using sub-micron process technology, simulation and silicon may not correlate well on duty cycle, resulting in duty cycle distortion. Such duty cycle distortion may be detected by probing from DDR CK or DQS outputs, and/or by observing the impact on DQS vs DQ timing (DLL 90). If duty cycle is off, the DLL could generate improper 90 degree offset.

Figure 1D:
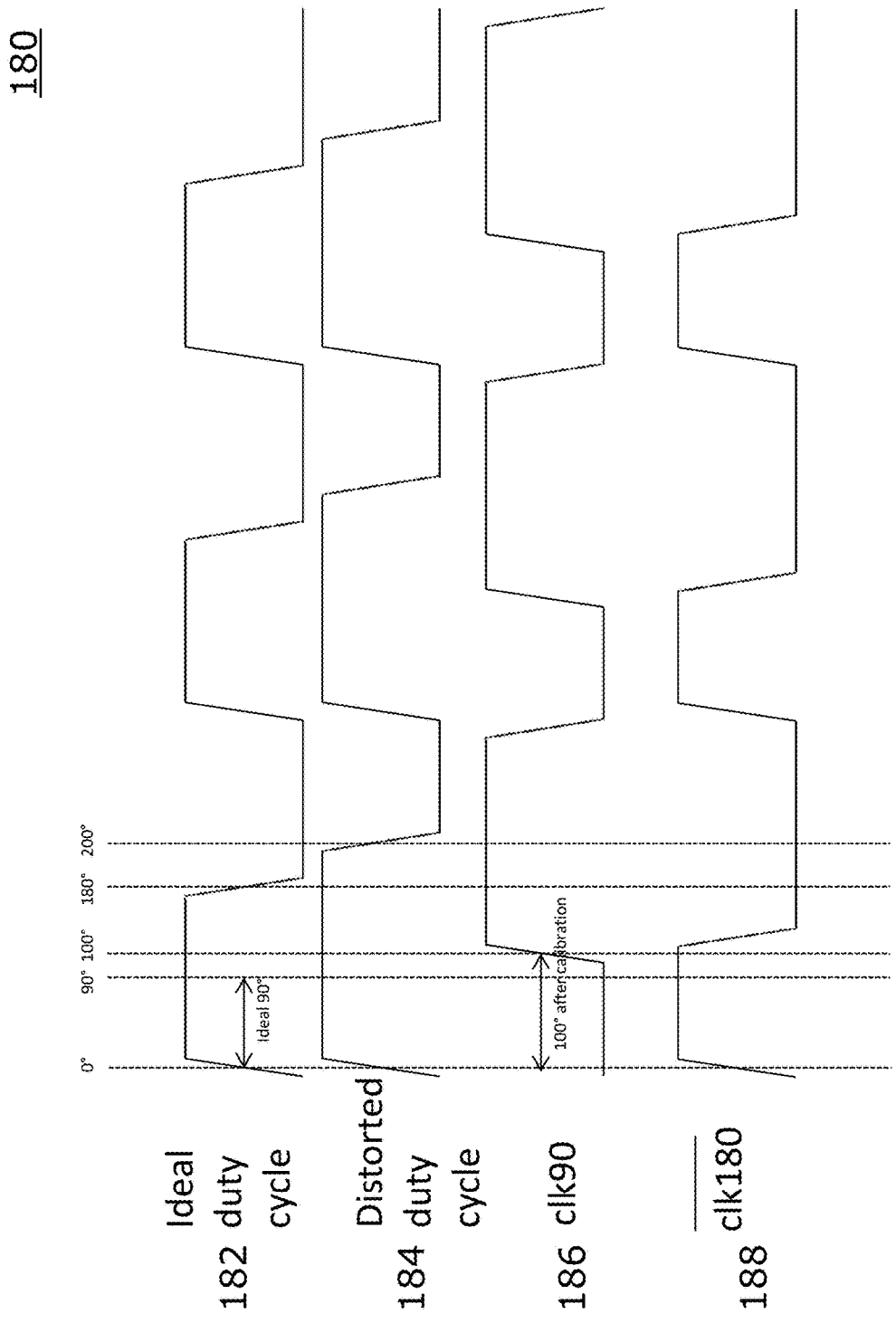
FIG. 1D is a signal diagram of inputs and outputs of a quadrature DLL in the presence of duty cycle distortion, according to some embodiments of the present disclosure.

As illustrated in FIG. 1D (element 180), distorted duty cycle (element 184) causes DLL 90 calibration to be off from the ideal duty cycle (182). In this example, assuming the distorted duty cycle (element 184) has a positive pulse width of 200 degrees of a cycle instead of 180 degrees ideally. The half of 200 degrees is now 100 degrees. As a result of distortion, the clk90 (element 186) is supposed to be 90 degree offset the starting edge, but now is 100 degrees instead (as illustrated in element 186). FIG. 1D also illustrates how a distorted duty cycle may result in an erroneous inverse of a corresponding 180 degree offset (element 188).

However, the disclosed circuits and methods overcome the above-mentioned limitations of existing circuits by detecting, adjusting, and/or correcting one or more distorted duty cycles of incoming signals. FIGS. 2A-B and FIGS. 4-6 illustrate circuits that correct duty cycle distortion, according to some embodiments of the present disclosure.

Figure 2A:
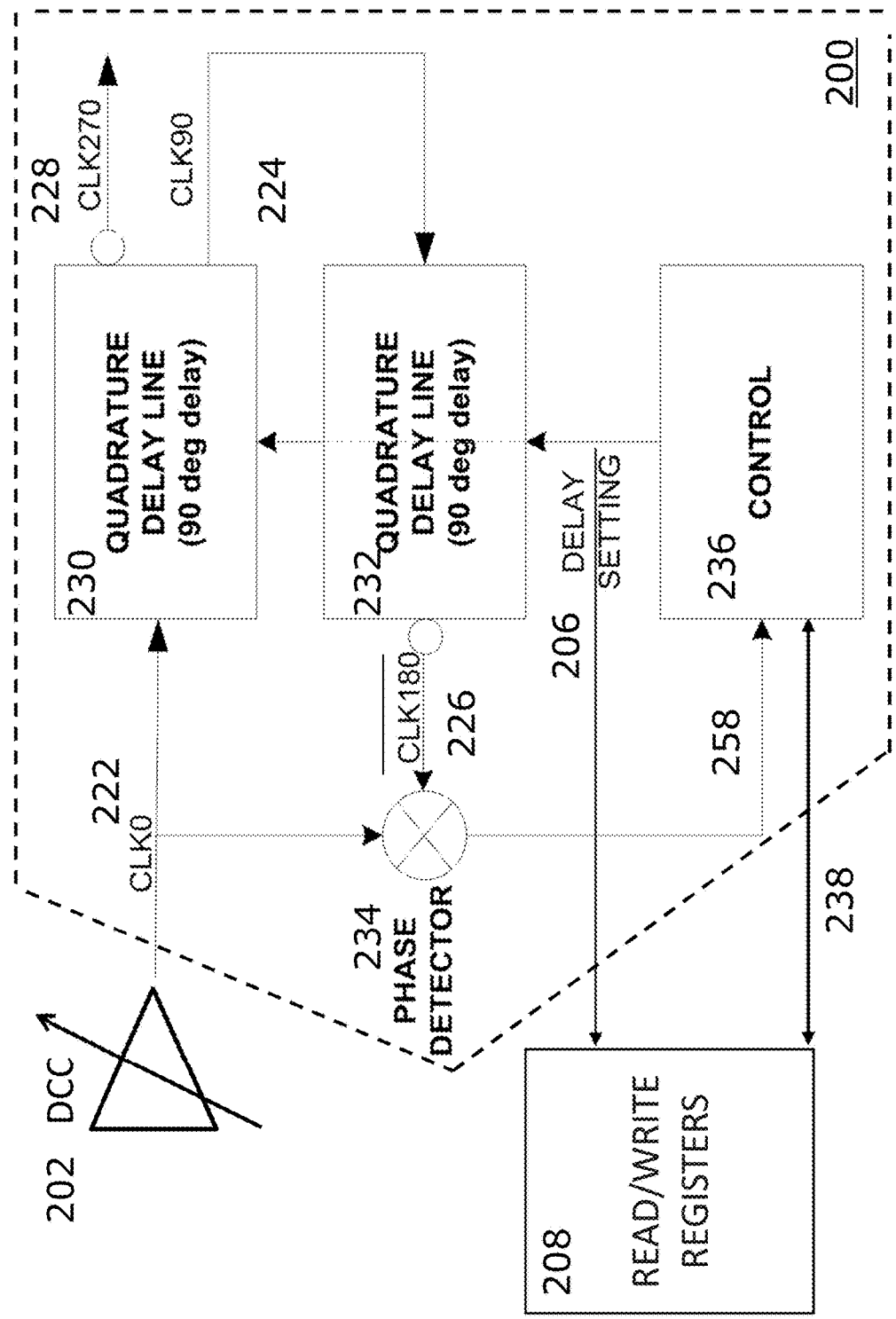
FIG. 2A illustrates a circuit that corrects duty cycle distortion using software control, according to some embodiments of the present disclosure.
Figure 2B:
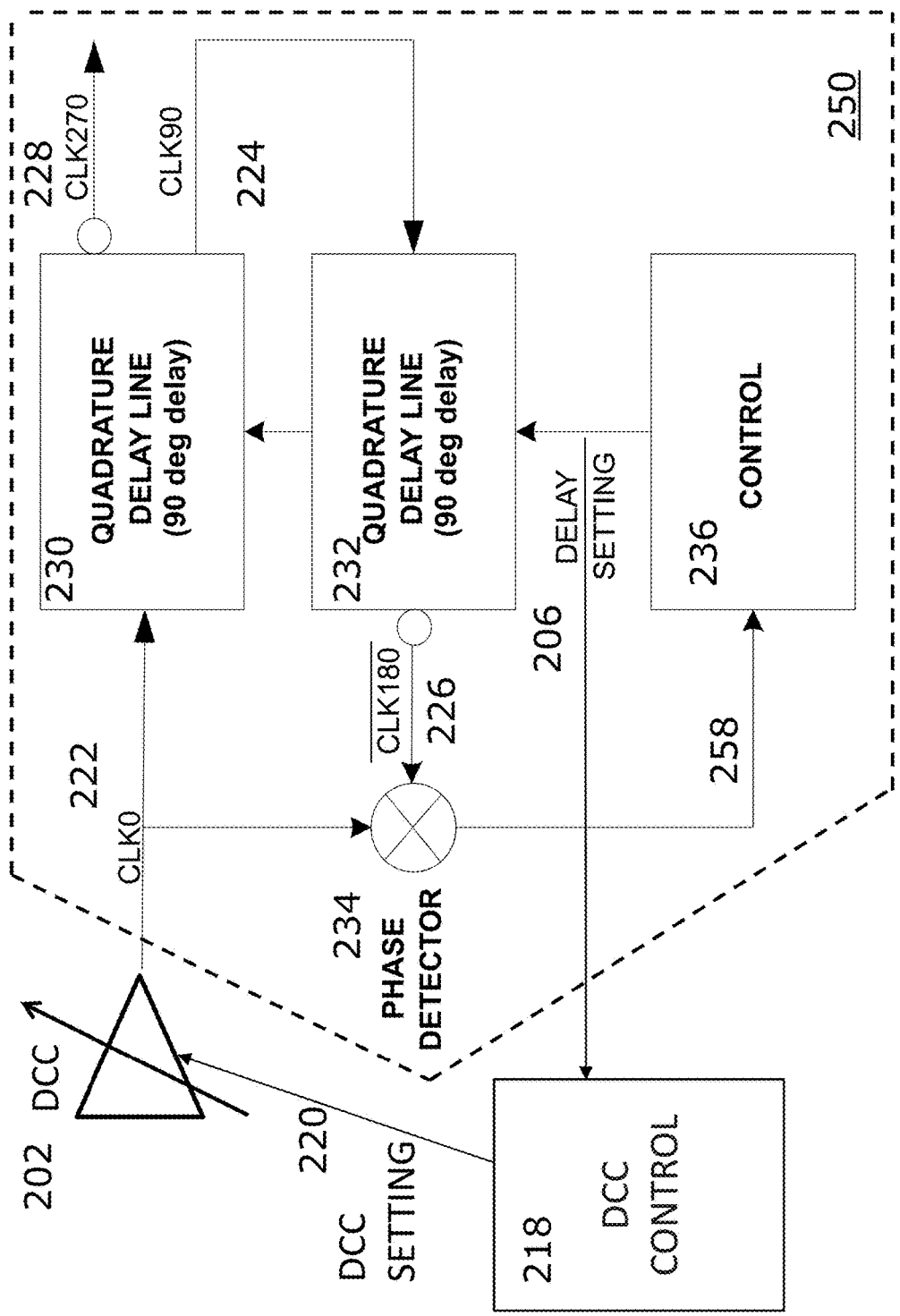
FIG. 2B illustrates a circuit that corrects duty cycle distortion using hardware control, according to some embodiments of the present disclosure.

FIG. 2A illustrates a circuit that corrects duty cycle distortion using software control, according to some embodiments of the present disclosure. FIG. 2B illustrates a circuit that corrects duty cycle distortion using hardware control, according to some embodiments of the present disclosure.

FIGS. 2A-B illustrate duty cycle correctors (DCCs, element 202) and corresponding DLLs (element 200 of FIG. 2A, element 250 of FIG. 2B, respectively). As illustrated in FIGS. 2A-B, a duty cycle corrector (DCC, element 202) may be added, which may forward a signal (e.g., clock signal), CLK0 (element 222), into a phase detector 234 and first quadrature delay line (element 230). The first quadrature delay line (element 230) may generate a 90-degree delayed clock (CLK90, element 224), and a 270-degree delayed clock (element 228). A second quadrature delay line (element 232) may receive CLK90 (element 224) and forward an inverted CLK180 (element 226) to the phase detector (element 234). A combined duty cycle and DLL controller (element 236) may receive the output (element 258) of the phase detector (element 234) and generate a delay setting (element 206) that it provides to the first and second quadrature delay lines (element 230 and 232).

In FIG. 2A, duty cycle distortion of CLK0 (element 222) is corrected by computer-implemented software and/or programmed physical registers (i.e., flip-flops). As such, the combined duty cycle and DLL controller (element 236) may generate the delay setting (element 206) based upon one or more register settings and/or commands (element 238) of read/write registers (element 208). As such, under software control (of FIG. 2A) the duty cycle of CLK0 (element 222) may be adjusted by the combined duty cycle and DLL controller (element 236) through generating DCC setting to the duty cycle corrector (DCC, element 202).

In FIG. 2B, duty cycle distortion of CLK0 (element 222) is corrected by hardware. As such, the duty cycle controller (element 218) may receive the delay setting (element 206) generated from the DLL controller (element 236) and another copies of delay setting (element 206) are provided to the first and second quadrature delay lines (element 230 and 232). As such, in each of FIG. 2B, the duty cycle of CLK0 (element 222) may be adjusted through a duty cycle controller (element 218) which generates DCC setting (element 220) to the duty cycle corrector (DCC, element 202) through iterative DLL trainings.

Figure 3:
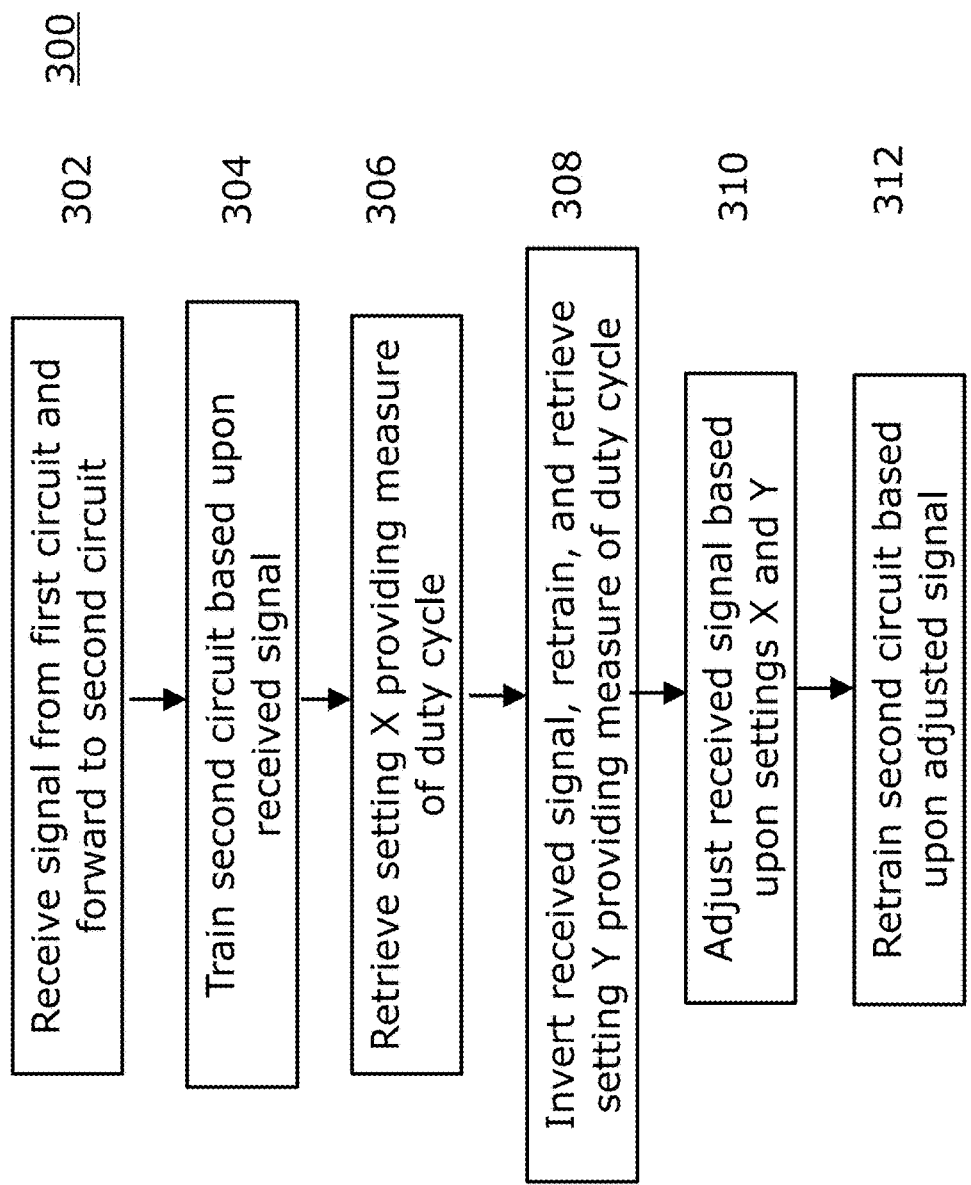
FIG. 3 illustrates a flowchart of an example method (or part of a circuit) that corrects duty cycle distortion, according to some embodiments of the present disclosure.

FIG. 3 illustrates a flowchart of an example method (or part of a circuit) 300 that corrects duty cycle distortion, according to some embodiments of the present disclosure.

As illustrated in FIG. 3, according to some embodiments, a method (or part of a circuit) 300 may be employed using one or more of the following steps:

1. Bring up DLL as usual, read out DLL setting X (elements 302, 304, 306, collectively).

2. Invert PLL output and re-train DLL again, read out DLL setting Y (element 308).

3. Invert PLL output back and re-train DLL along with adjusting DCC through interactive loops such that final DLL setting is (X+Y)/2 (elements 310, 312, collectively).

As further illustrated in FIG. 3, in some embodiments, a method (or circuit, or part of a circuit) 300 may receive a signal 302 from a first circuit and forward the received signal to a second circuit. In some embodiments, the method (or part of a circuit) 300 may train 304 the second circuit based upon the received signal. In some embodiments, the method (or circuit, or part of a circuit) 300 may retrieve 306 a first setting (X) of the trained second circuit associated with the received signal. The first setting (X) may provide a measure of duty cycle of the received signal. In some embodiments, the method (or part of a circuit) 300 may invert the received signal, retrain the second circuit based upon the inverted received signal, and/or retrieve 308 a second setting (Y) of the retrained second circuit. The second setting (Y) may provide a measure of duty cycle of the inverted received signal. In some embodiments, the method (or part of a circuit) 300 may adjust 310 the duty cycle of the received signal based upon an adjustment value including the first setting (X) and the second setting (Y). In some embodiments, the circuits and methods may further retrain 312 the second circuit based upon the adjusted received signal.

In some embodiments of the method (or circuit, or part of a circuit) 300, the first circuit may include (and/or may be) a phase locked loop (PLL). The second circuit may include (and/or may be) a delay locked loop (DLL). In other embodiments the received signal may be a digital signal provided by a differential analog-to-digital converter of the first circuit. The first setting (X) may provide a measure of pulse width associated with the received signal. In some embodiments, the method (or circuit, or part of a circuit) 300 may further adjust the duty cycle of the received signal based upon the measure of pulse width (associated with the received signal). The second setting (Y) may provide a measure of pulse width associated with the inverted received signal. In some embodiments, the method (or circuit, or part of a circuit) 300 may further adjust the inverted received signal based upon the measure of pulse width (associated with the inverted received signal).

In some embodiments, the method (or circuit, or part of a circuit) 300 may comprise one or more of: at least one of the first setting (X) and the second setting (Y) indicating a number of delay taps, and the retrieving of at least one of the first setting (X) and the second setting (Y) based upon one or more register reads.

In some embodiments, the method (or circuit, or part of a circuit) 300 may retrieve a given setting of the second circuit based upon the further retraining, and may perform the following sequence of steps one or more times without limitation (e.g., in any order, any number of the steps): (1) performing a comparison between the given setting of the second circuit and the adjustment value; (2) further adjusting the received signal based upon the comparison; (3) performing a given additional retraining of the second circuit based upon the further adjusted received signal; and/or (4) retrieving the given setting of the second circuit based upon the additional retraining. Adjusting the received signal may include modifying the duty cycle of the received signal in a direction closer to a 50 percent duty cycle. In addition, the received signal may be a periodic signal.

Figure 4:
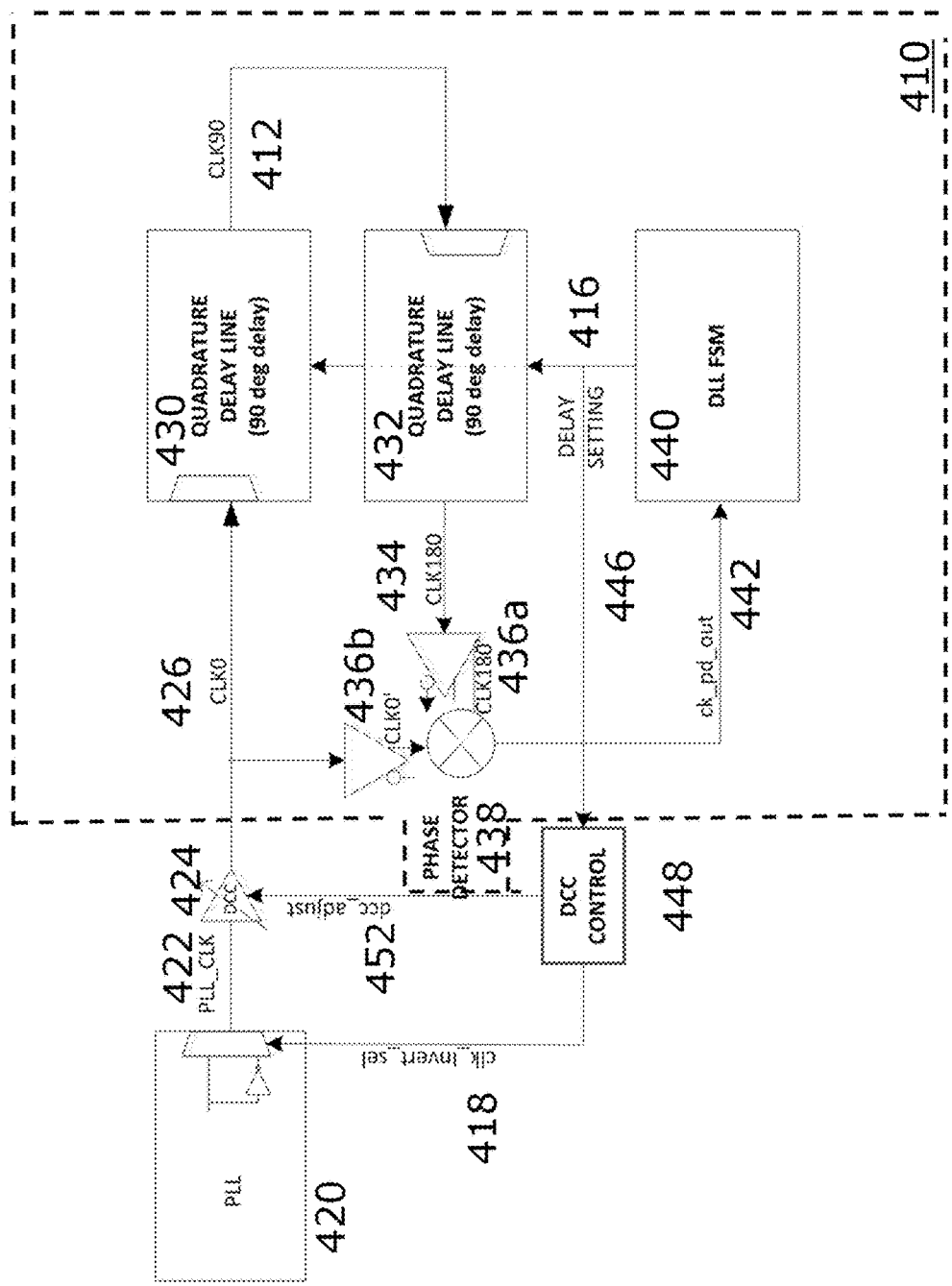
FIG. 4 illustrates another circuit that corrects duty cycle distortion, according to some embodiments of the present disclosure.

FIG. 4 illustrates another circuit that may correct duty cycle distortion, according to some embodiments of the present disclosure. As illustrated in FIG. 4, by using a DLL (410), some embodiments may calibrate the duty cycle of an input clock (element 422). Having a good duty cycle of the input clock (element 422) improves the accuracy of quadrature (¼ CK) phase shift (element 412) generated from the DLL (element 410).

As illustrated in FIG. 4, a first circuit may include a PLL (element 420) which may forward a PLL clock (element 422) to a duty cycle corrector (DCC, element 424). In turn, the DCC (element 424) may forward the PLL clock (element 422) as in input clock (element 426) to the first quadrature delay line (element 430) and through a buffer (element 436b) into the phase detector 438. The first quadrature delay line (element 430) of the DLL (element 410) may generate a 90-degree delayed clock (CLK90, element 412). A second quadrature delay line (element 432) may receive the 90-degree delayed clock (CLK90, element 412) and forward an CLK180 (element 434) through a buffer (element 436a) and generate an inverted CLK180 to the phase detector (element 438).

The DLL finite state machine (FSM, element 440) may receive the output (element 442) of the phase detector (element 438). Based upon the output (element 442) of the phase detector (element 438), the DLL FSM (element 440) may generate a delay setting (element 416) which is forwards to the duty cycle controller (element 448). The DLL FSM (element 440) also forwards the generated delay setting (element 416) to the input of the first and second quadrature delay lines (element 430 and 432) to provide a feedback loop so that the duty cycle may be iteratively corrected (and/or adjusted).

The duty cycle controller (element 448) may control (adjust, and/or correct) the duty cycle by generating a DCC adjustment output (element 452) that the duty cycle controller (element 448) forwards to the duty cycle corrector (DCC, element 424). The duty cycle controller (element 448) may also control (adjust, and/or correct) the duty cycle by generating a clock inversion select output (element 418) that the duty cycle controller (element 448) forwards to the PLL (element 420).

Figure 5:
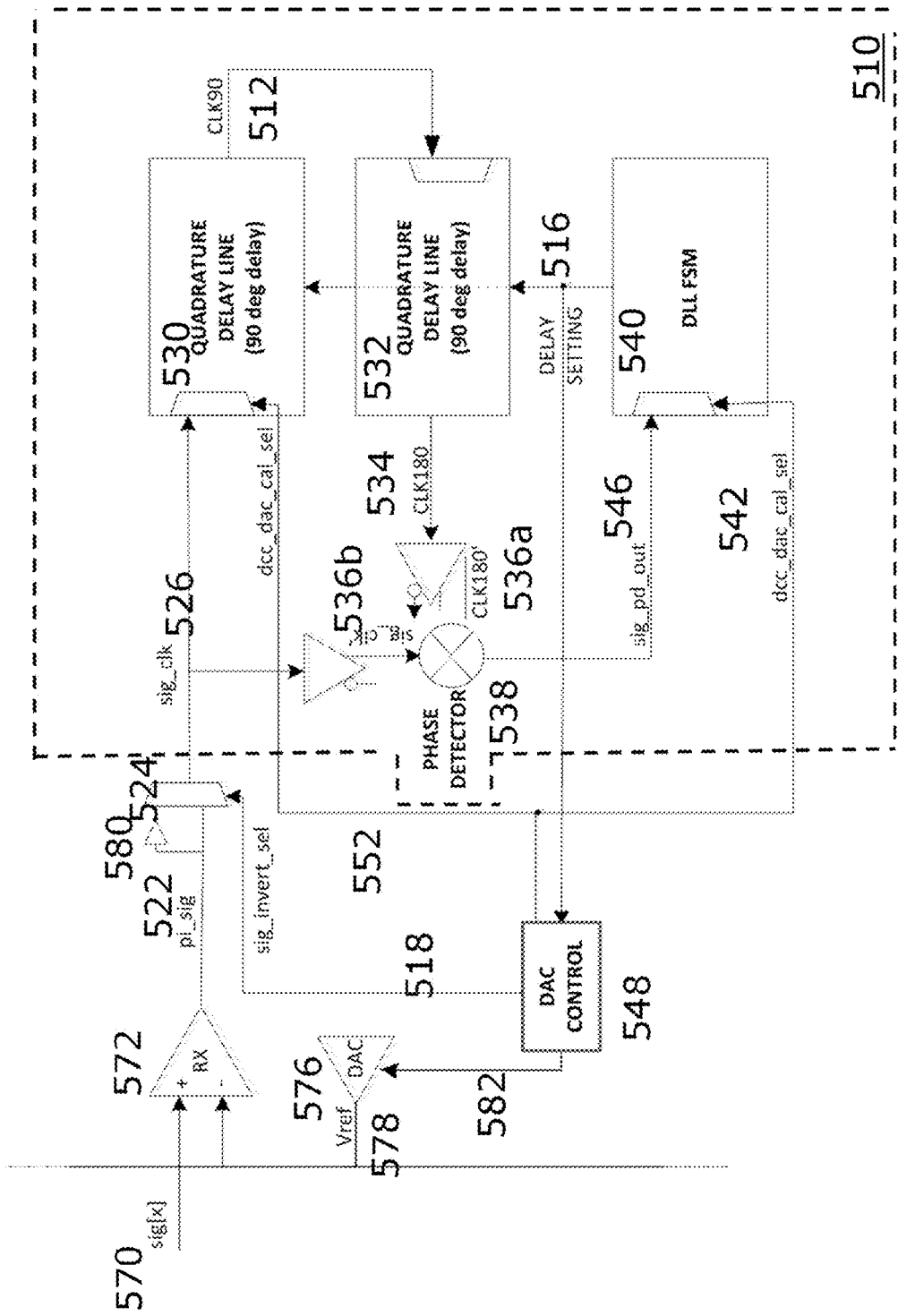
FIG. 5 illustrates a circuit that corrects duty cycle distortion associated with an analog-to-digital input signal, according to some embodiments of the present disclosure.

FIG. 5 illustrates a circuit that corrects duty cycle distortion associated with an analog-to-digital input signal, according to some embodiments of the present disclosure. As illustrated in FIG. 5, digital-to-analog converter (DAC) calibration may be applied by using a DLL (element 510) as a measurement tool for duty cycle. According to some embodiments, the design of FIGS. 4-5 may use a DLL (elements 410, 510, respectively) to perform DCC calibration for clocks derived from a clock tree (not shown in FIGS. 4-5). Embodiments of FIG. 5 may provide additional advantages by providing additional visibility of the duty cycle pi_sig (element 522). The circuit of FIG. 5 may be used to quantify (and/or debug) the duty cycle on pi_sig (element 522) and adjust a DAC (element 576) accordingly.

Figure 7A:
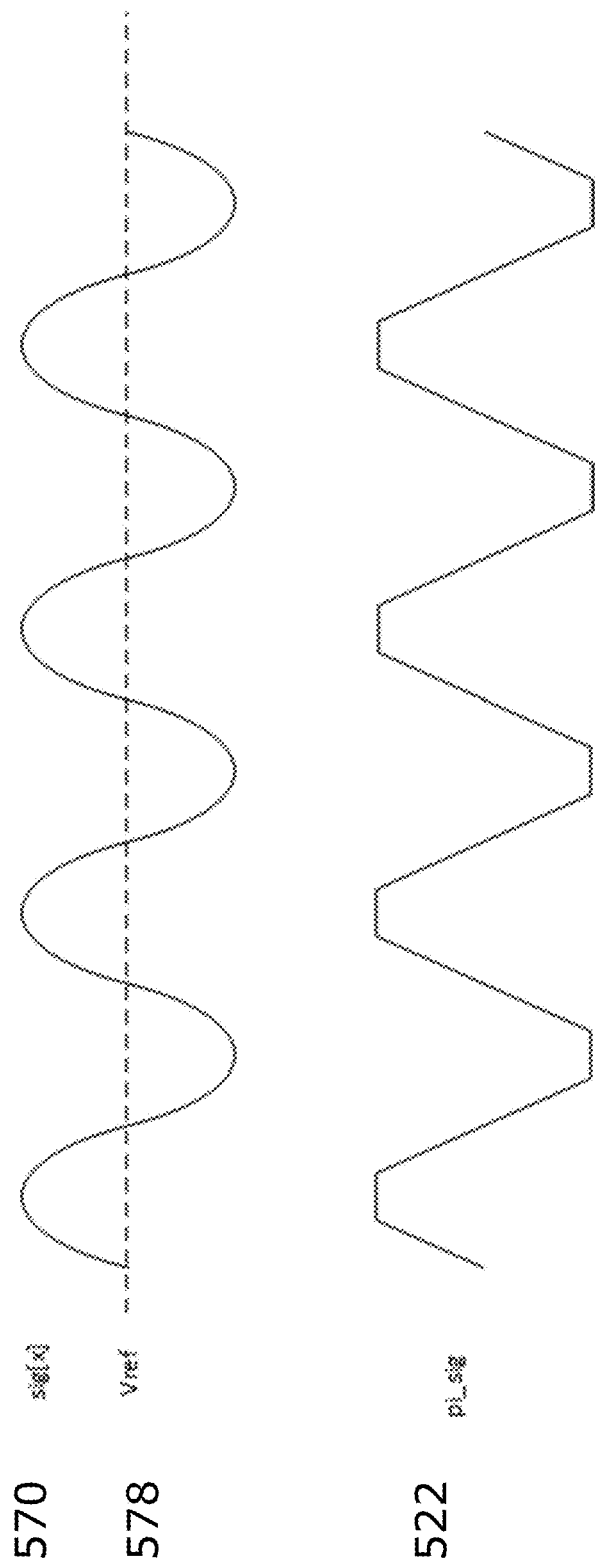
FIGS. 7A-C illustrate a signal diagram of inputs and outputs associated with a circuit corresponding to the analog-to-digital input signal of FIG. 5.
Figure 7B:
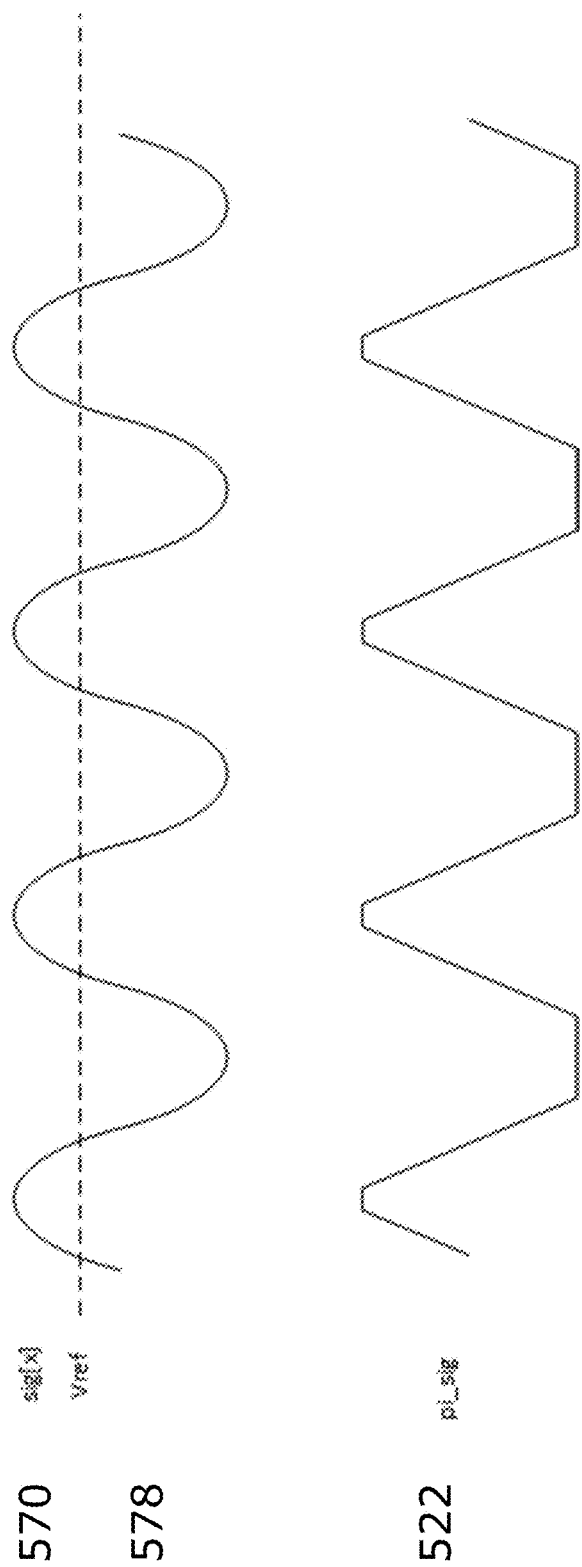
Figure 7C:
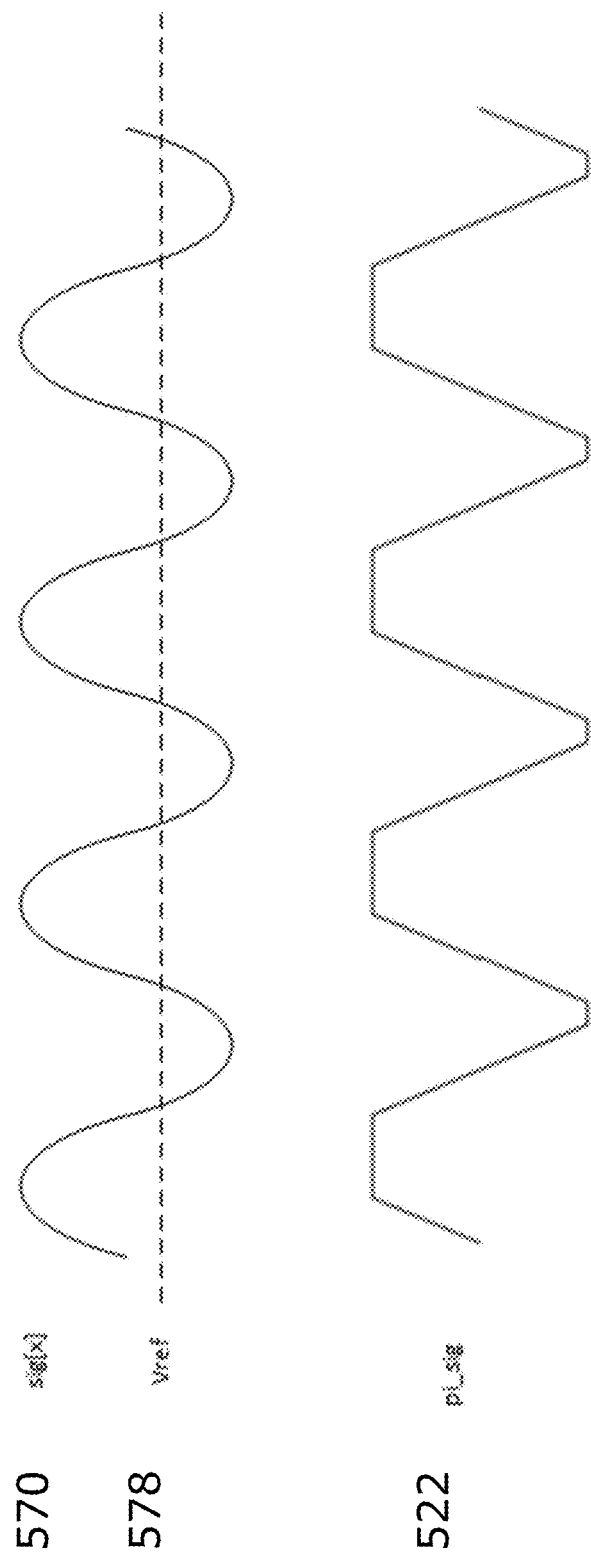

FIGS. 7A-C illustrate a signal diagram of inputs and outputs corresponding to the analog-to-digital converter 572 and its inputs 570, 578 and output 522 of FIG. 5. As illustrated collectively in FIGS. 5 and 7A-C, according to some embodiments, a first circuit may include a differential analog-to-digital converter (ADC), also referred to as a receiver RX (element 572) of FIG. 5. The ADC (element 572) may receive as its differential inputs a voltage reference (element 578, Vref of FIG. 5 and element 578 of FIGS. 7A-C) and data bits (element 570, sig[x] of FIG. 5 and FIGS. 7A-C) and generate a digital output (element 522, pi_sig of FIG. 5 and FIGS. 7A-C).

As illustrated in FIGS. 7A-C, the voltage reference (element 578) may be a direct-current (DC) level voltage, but is not so limited. As also illustrated in FIGS. 7A-C, the data bits (element 570) may be sinusoidal data, but is not so limited. As illustrated in FIG. 7A, according to some embodiments, when the voltage reference (element 578) overlaps with the data bits (element 570) such that the voltage reference (element 578) is present in the middle of (or at the average value of) the voltage (and/or amplitude) level of the data bits (element 570), then the circuit may generate a digital output (element 522) with a 50 percent (ideal) duty cycle. In other words, FIG. 7A illustrates calibration of the digital-to-analog converter, or DAC (element 548 of FIG. 5) for a Vref level (element 578) with an ideal Vref location.

As illustrated collectively in FIGS. 7B-C, a potential problem in existing circuits is that the voltage reference (element 578) may be too high (FIG. 7B) or too low (FIG. 7C) with respect to the data bits (element 570), resulting in distortion of the data output (element 522) with a non-ideal duty cycle. As such, as illustrated collectively in FIGS. 7B-C, the distorted (non-ideal) data output (element 522) may have a duty cycle that is greater than 50 percent at its positive pulse width (FIG. 7C) or less than 50 percent at its positive pulse width (FIG. 7B). In other words, FIGS. 7B-C illustrate calibration of the digital-to-analog converter, or DAC (element 548 of FIG. 5) for Vref levels (element 578) that are too high (FIG. 7B) or too low (FIG. 7C) with respect to the data bits (element 570), thereby causing duty cycle distortion.

However, as illustrated in FIG. 7A, embodiments of the disclosed circuits and methods overcome the above-mentioned limitations of existing circuits by detecting, adjusting, and/or correcting one or more distorted duty cycles of signals (such as the output signal element 522).

Referring back to the circuit of FIG. 5, the ADC (element 572) generates a digital data output (element 522) that is forwarded directly (element 522) to a data input of a multiplexer (element 524) and also forwarded through a buffer (element 580) to another data input of the multiplexer (element 524). The multiplexer (element 524) may be controlled (i.e., selected) by the output (element 518) of a digital-to-analog controller (DAC controller, element 548 of FIG. 5, which, according to some embodiments, is also analogous to the DCC controller 448 of FIG. 4).

In turn, the multiplexer (element 524) may forward its digital output (element 526) as in input clock (element 526) to the DLL (element 510) and through a buffer (element 536b) into the phase detector 538. The DAC control (element 548) may enable forwarding of the clock (element 526) into the first quadrature delay line (element 530) by sending a select (and/or enable) signal (element 552) to the first quadrature delay line (element 530).

The first quadrature delay line (element 530) of the DLL (element 510) may generate a 90-degree delayed clock (CLK90, element 512). A second quadrature delay line (element 532) may receive the 90-degree delayed clock (CLK90, element 512) and forward CLK180 (element 534) through a buffer (element 536a) and generate an inverted CLK180 to the phase detector (element 538).

A DLL finite state machine (DLL FSM, element 540) may receive the output (element 546) of the phase detector (element 538). Based upon receiving the output (element 546) of the phase detector (element 538), the DLL FSM (element 540) may generate a delay setting (element 516) which it forwards to the DAC controller (element 548). The DAC control (element 548) may enable forwarding of the phase detector output (element 538) into the DLL FSM (element 540) by sending a select (and/or enable) signal (element 542) to the DLL FSM (element 540). The DLL FSM (element 540) may also forward the generated delay setting (element 516) to the input of the first and second quadrature delay lines (element 530 and 532) to provide a feedback loop so that the duty cycle may be iteratively corrected (and/or adjusted).

The DAC control (element 548) may control (adjust, and/or correct) the duty cycle by adjusting the digital input (element 582) into the DAC (element 576), resulting in an adjusted voltage reference signal (element 578) output from the DAC (element 576). The duty cycle controller (element 548) may also send a control (and/or select) signal (element 518) to the multiplexer (element 524) to invert the signal sig_clk (element 526).

Figure 6:
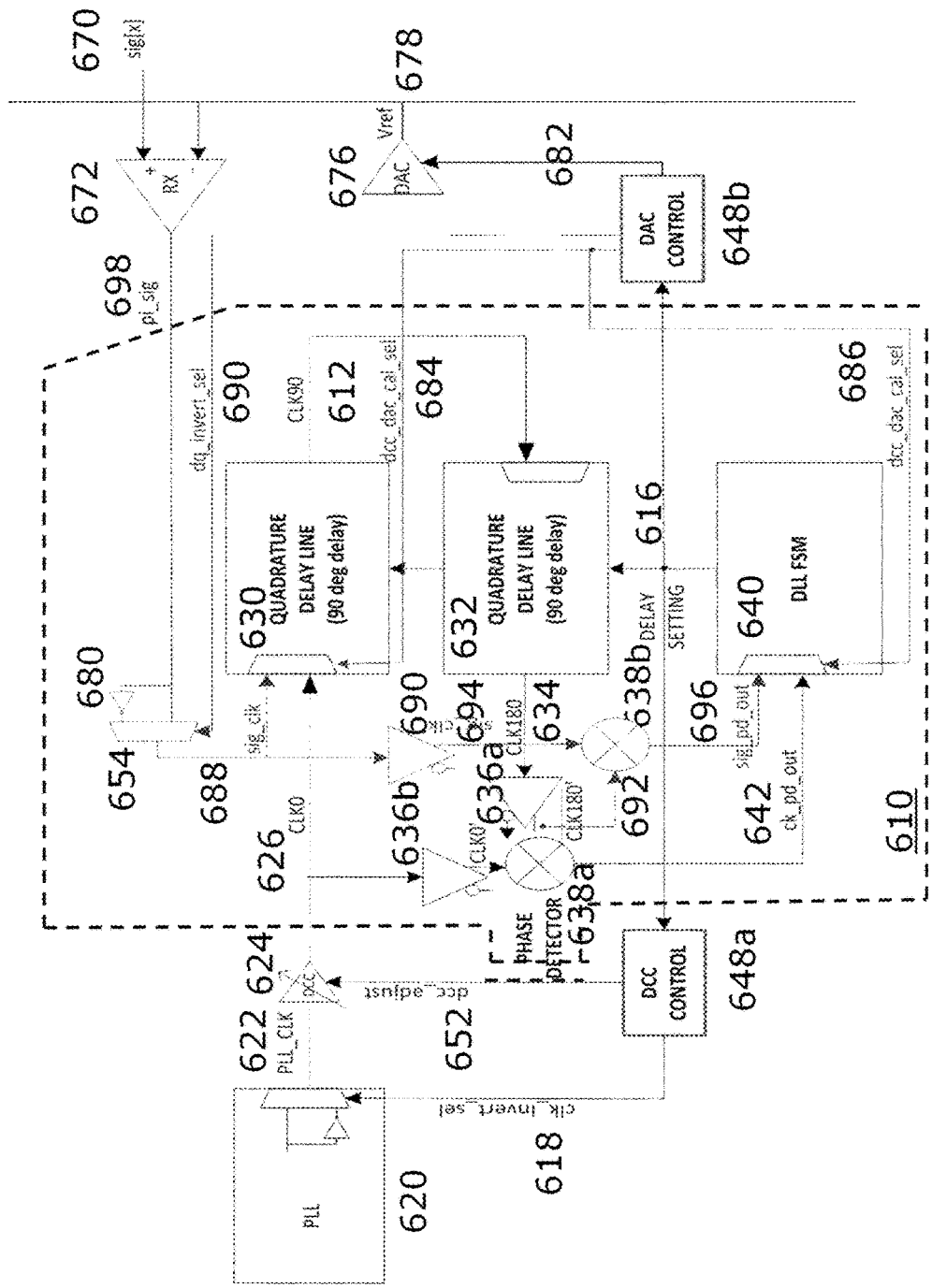
FIG. 6 illustrates an aggregate circuit that corrects duty cycle distortion by multiplexing at least a portion of the circuitry of FIGS. 4-5, according to some embodiments of the present disclosure.

FIG. 6 illustrates an aggregate circuit that corrects duty cycle distortion by multiplexing at least a portion of the circuitry of FIGS. 4-5, according to some embodiments of the present disclosure. As illustrated in FIG. 6, a DAC control (element 648b) may generate control signals (elements 684, 686) that act as select signals into the first quadrature delay line (element 630) and DLL FSM (element 640), respectively, to select either an ADC path like that of FIG. 5 (FIG. 6 elements 688, 696, respectively) or a DCC control path like that of FIG. 4 (FIG. 6 elements 626, 642, respectively) within the first quadrature delay line (element 630) and DLL FSM (element 640), respectively.

FIG. 6 illustrates correction of duty cycle distortion, according to some embodiments of the present disclosure. As illustrated in FIG. 6, by using a DLL (element 610), some embodiments may calibrate the duty cycle of an input clock (element 622). Having a good duty cycle of the input clock (element 622) improves the accuracy of quadrature (¼ CK) phase shift (element 612) generated from the DLL (element 610).

As illustrated in FIG. 6, a first circuit may include a PLL (element 620) which may forward a PLL clock (element 622) to a duty cycle corrector (DCC, element 624). In turn, the DCC (element 624) may forward the PLL clock (element 622) as its input clock (element 626) to the first quadrature delay line (element 630) and through a buffer (element 636b) into the phase detector 638a. The first quadrature delay line (element 630) of the DLL (element 610) may generate a 90-degree delayed clock (CLK90, element 612). A second quadrature delay line (element 632) may receive the 90-degree delayed clock (CLK90, element 612) and forward an CLK180 (element 634) through a buffer (element 636a) and generate an inverted CLK180 to the phase detectors (elements 638a, 638b). The buffer (element 636a) forwards the CLK180 (element 634) and generate an inverted CLK180 to phase detector (element 638a) that in turn provides a phase detector output (element 642) to the DLL finite state machine (FSM, element 640) for the DCC control 648a path. Similarly, the buffer (element 636a) forwards the CLK180 (element 634) and generate an inverted CLK180 to phase detector (element 638b) that in turn provides a phase detector output (element 696) to the DLL finite state machine (FSM, element 640) for the digital-to-analog (DAC) control 648b path. As such, the DLL finite state machine (FSM, element 640) may receive the outputs (elements 642, 696, respectively) of the phase detectors (elements 638a, 638b, respectively).

If the DCC control 648a path is selected as described above, then, based upon the output (element 642) of the phase detector (element 638a), the DLL FSM (element 640) may generate a delay setting (element 616) which it forwards to the duty cycle controller (element 648a). The DLL FSM (element 640) also forwards the generated delay setting (element 616) to the DAC controller (element 648b) and to the input of the first and second quadrature delay lines (element 630 and 632) to provide a feedback loop so that the duty cycle may be iteratively corrected (and/or adjusted).

The duty cycle controller (element 648a) may control (adjust, and/or correct) the duty cycle by generating a DCC adjustment output (element 652) that the duty cycle controller (element 648a) forwards to the duty cycle corrector (DCC, element 624). The duty cycle controller (element 648a) may also control (adjust, and/or correct) the duty cycle by generating a clock inversion select output (element 618) that the duty cycle controller (element 648a) forwards to the PLL (element 620).

FIG. 6 also illustrates a circuit that corrects duty cycle distortion associated with an analog-to-digital input signal, according to some embodiments of the present disclosure. As illustrated in FIG. 6, digital-to-analog converter (DAC) calibration may be applied by using a DLL (element 610) as a measurement tool for duty cycle. According to some embodiments, the design of FIG. 6 may use a DLL (element 610) to perform DCC calibration for clocks derived from a clock tree (not shown in FIG. 6).

Embodiments of FIG. 6 provide additional advantages by providing additional visibility of the duty cycle on pi_sig (element 698). The circuit of FIG. 6 may be used to quantify (and/or debug) the duty cycle on pi_sig (element 698) and adjust a DAC (element 648b) accordingly.

According to some embodiments, FIGS. 7A-C illustrate a signal diagram of inputs and outputs associated with a circuit corresponding to the analog-to-digital input signal of FIG. 6. As illustrated collectively in FIGS. 6 and 7A-C, according to some embodiments, a first circuit may include a differential analog-to-digital converter (ADC), also referred to as a receiver RX (element 672) of FIG. 6. The ADC (element 672) may receive as one of its differential inputs a voltage reference (element 678, Vref of FIG. 6, analogous to element 578 of FIGS. 7A-C) and at another of its differential inputs data bits (element 670, sig[x] of FIG. 6, and sig[x], element 570 of FIGS. 7A-C) and generate a digital output ("pi_sig," element 698 of FIG. 6 and element 522 of FIGS. 7A-C).

Referring back to the circuit of FIG. 6, the ADC (element 672) may generate a digital data output (element 698) that is forwarded directly (element 698) to a data input of a multiplexer (element 654) and is also forwarded through a buffer (element 680) to another data input of the multiplexer (element 654). The multiplexer (element 654) may be controlled (i.e., multiplexer output 688 selected) by the output (element 690) of a digital-to-analog controller (DAC controller, element 648*b* of FIG. 6, also analogous to the DCC controller 648*a* of FIG. 6, according to some embodiments).

In turn, the multiplexer (element 654) may forward its output (element 688) as in input clock (element 688) to the first quadrature delay line (element 630) and through a buffer (element 690) into the phase detector 638*b*. The DAC control (element 648*b*) may enable forwarding of the clock (element 688) into the first quadrature delay line (element 630) by sending a select (and/or enable) signal (element 684) to the first quadrature delay line (element 630).

The first quadrature delay line (element 630) of the DLL (element 610) may generate a 90-degree delayed clock (CLK90, element 612). A second quadrature delay line (element 632) may receive the 90-degree delayed clock (CLK90, element 612) and forward CLK180 (element 634) through a buffer (element 636*a*) and generated an inverted CLK180 to a phase detector (element 638*a*).

A DLL finite state machine (DLL FSM, element 640) may receive the output (element 696) of the phase detector (element 638*b*). Based upon receiving the output (element 696) of the phase detector (element 638*b*), the DLL FSM (element 640) may generate a delay setting (element 616) which it forwards to the DAC control (element 648*b*, also known as DAC controller herein). The DAC control (element 648*b*) may enable forwarding of the phase detector output (element 696) into the DLL FSM (element 640) by sending a select (and/or enable) signal (element 686) to the DLL FSM (element 640). The DLL FSM (element 640) also forwards the generated delay setting (element 616) to the input of the first and second quadrature delay lines (element 630 and 632) to provide a feedback loop so that the duty cycle may be iteratively corrected (and/or adjusted).

The DAC control (element 648*b*) may control (adjust, and/or correct) the duty cycle by adjusting the digital input (element 682) into the DAC (element 676), resulting in an adjusted voltage reference signal (element 678) output from the DAC (element 676). Similarly, the duty cycle controller (element 648*a*) may also send a control (and/or select) signal (element 652) to the duty cycle controller (element 624) to control (adjust, and/or correct) the duty cycle by controlling the output (element 626) of the duty cycle corrector (element 624).

According to some embodiments, the DLLs (elements 410, 510, 610, respectively) of the circuits of FIGS. 4-6 may be considered to be included in a second circuit. Also, according to some embodiments, at least a portion of the circuitry outside of the DLLs (elements 410, 510, 610, respectively) may be considered to be included in a first circuit. According to other embodiments, at least a portion of the circuitry outside of the DLLs (elements 410, 510, 610, respectively) may be considered to be included in a first circuit, and at least another portion of the circuitry outside of the DLLs (elements 410, 510, 610, respectively) may be considered to be included in a third circuit.

FIG. 8 illustrates a case study of the effects of process variation on duty cycle, according to some embodiments of the present disclosure. As illustrated in FIG. 8, process variation may result in varying duty cycle across a circuit.

Note that one of ordinary skill in the art appreciates that buffers and/or inverters, inverted inputs/output, and other circuit elements, may be added or removed from the circuits described herein, in order to modify the circuit functionality (data, clocks, or other circuitry) as needed for a given application. Therefore, some embodiments are not limited to the exact circuits shown herein and may be extended, while still relying upon the concepts of the some embodiments.

Some embodiments may be applied to any type of circuit, including, but not limited to, electronic circuits, semiconductors, integrated circuits, Very Large Scale Integrated Circuits (VLSI ICs), Application Specific Integrated Circuits (ASICs), circuitry on printed circuit boards (PCBs), nanotechnology circuits, and other types of circuits.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method comprising:
   receiving a signal from a first circuit and forwarding the received signal to a second circuit;
   training the second circuit based upon the received signal;
   retrieving a first setting (X) of the trained second circuit associated with the received signal, the first setting (X) providing a measure of duty cycle of the received signal,
   inverting the received signal, retraining the second circuit based upon the inverted received signal, retrieving a second setting (Y) of the retrained second circuit, the second setting (Y) providing a measure of duty cycle of the inverted received signal;
   adjusting the duty cycle of the received signal based upon an adjustment value including the first setting (X) and the second setting (Y); and
   further retraining the second circuit based upon the adjusted received signal.

2. The method of claim 1, wherein the first circuit includes a phase locked loop (PLL).

3. The method of claim 1, wherein the second circuit includes a delay locked loop (DLL).

4. The method of claim 1, wherein the first circuit includes a differential analog-to-digital converter.

5. The method of claim 1, wherein the first setting (X) provides a measure of pulse width associated with the received signal, and further adjusting the received signal based upon the measure of pulse width.

6. The method of claim 1, wherein the second setting (Y) provides a measure of pulse width associated with the inverted received signal, and further adjusting the inverted received signal based upon the measure of pulse width.

7. The method of claim 1, further comprising one or more of:
   at least one of the first setting (X) and the second setting (Y) indicating a number of delay taps; and
   the retrieving of at least one of the first setting (X) and the second setting (Y) based upon one or more register reads.

8. The method of claim 1, further comprising retrieving a given setting of the second circuit based upon the further retraining, and performing the following sequence of steps one or more times:
   performing a comparison between the given setting of the second circuit and the adjustment value;
   further adjusting the received signal based upon the comparison;

performing a given additional retraining of the second circuit based upon the further adjusted received signal; and retrieving the given setting of the second circuit based upon the additional retraining.

9. The method of claim 1, wherein adjusting the received signal includes modifying the duty cycle of the received signal in a direction closer to a 50 percent duty cycle.

10. The method of claim 1, wherein the received signal is a periodic signal.

11. A circuit comprising:
a duty cycle corrector configured to receive a signal from a first circuit and forward the received signal to a second circuit;
a duty cycle controller configured to train the second circuit based upon the received signal;
the duty cycle controller further configured to retrieve a first setting (X) of the trained second circuit associated with the received signal, the first setting (X) providing a measure of duty cycle of the received signal;
the duty cycle corrector further configured to invert the received signal, the duty cycle controller further configured to retrain the second circuit based upon the inverted received signal and to retrieve a second setting (Y) of the retrained second circuit, the second setting (Y) providing a measure of duty cycle of the inverted received signal;
the duty cycle corrector further configured to adjust the duty cycle of the received signal based upon an adjustment value including the first setting (X) and the second setting (Y); and
the duty cycle controller further configured to retrain the second circuit based upon the adjusted received signal.

12. The circuit of claim 11, wherein the first circuit includes a phase locked loop (PLL).

13. The circuit of claim 11, wherein the second circuit includes a delay locked loop (DLL).

14. The circuit of claim 11, wherein the first circuit includes a differential analog-to-digital converter.

15. The circuit of claim 11, wherein the first setting (X) provides a measure of pulse width associated with the received signal, and the duty cycle corrector is further configured to further adjust the duty cycle of the received signal based upon the measure of pulse width.

16. The circuit of claim 11, wherein the second setting (Y) provides a measure of pulse width associated with the inverted received signal, and the duty cycle corrector is further configured to further adjust the inverted received signal based upon the measure of pulse width.

17. The circuit of claim 11, further comprising one or more of:
at least one of the first setting (X) and the second setting (Y) indicating a number of delay taps; and
the duty cycle controller further configured to retrieve at least one of the first setting (X) and the second setting (Y) based upon one or more register reads.

18. The circuit of claim 11, wherein the duty cycle controller is further configured to retrieve a given setting of the second circuit based upon the further retraining, and perform the following sequence of steps one or more times:
perform a comparison between the given setting of the second circuit and the adjustment value;
further adjust the duty cycle of the received signal based upon the comparison;
perform a given additional retraining of the second circuit based upon the further adjusted received signal; and
retrieve the given setting of the second circuit based upon the additional retraining.

19. The circuit of claim 11, wherein the duty cycle corrector is further configured to further adjust the duty cycle of the received signal including modifying the duty cycle of the received signal in a direction closer to a 50 percent duty cycle.

20. The circuit of claim 11, wherein the received signal is a periodic signal.

* * * * *